(12) United States Patent
Kim et al.

(10) Patent No.: US 10,031,036 B2
(45) Date of Patent: Jul. 24, 2018

(54) BENDABLE DISPLAY APPARATUS

(71) Applicant: SAMSUNG DISPLAY CO., LTD., Yongin-si, Gyeonggi-do (KR)

(72) Inventors: Minsung Kim, Yongin-si (KR); Thanhtien Nguyen, Yongin-si (KR); Kiju Im, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/417,948

(22) Filed: Jan. 27, 2017

(65) Prior Publication Data

US 2017/0219444 A1 Aug. 3, 2017

(30) Foreign Application Priority Data

Jan. 29, 2016 (KR) .................. 10-2016-0011842

(51) Int. Cl.
| | |
|---|---|
| *G01L 1/22* | (2006.01) |
| *H01L 41/09* | (2006.01) |
| *H05K 1/18* | (2006.01) |
| *H05K 1/02* | (2006.01) |
| *H01L 27/32* | (2006.01) |
| *H01L 51/00* | (2006.01) |

(52) U.S. Cl.
CPC ............ *G01L 1/2287* (2013.01); *G01L 1/225* (2013.01); *H01L 27/3225* (2013.01); *H01L 27/3276* (2013.01); *H01L 41/09* (2013.01); *H05K 1/028* (2013.01); *H05K 1/189* (2013.01); *H01L 51/0097* (2013.01); *H01L 2251/5338* (2013.01); *H05K 2201/10083* (2013.01); *H05K 2201/10128* (2013.01); *H05K 2201/10151* (2013.01)

(58) Field of Classification Search
CPC ... G01L 1/2287; G01L 1/225; H01L 27/3225; H01L 27/3276; H01L 41/09; H01L 51/0097; H01L 2251/5338; H05K 1/028; H05K 1/189; H05K 2201/10083; H05K 2201/10128; H05K 2201/10151
USPC ..................................... 73/862.628
See application file for complete search history.

(56) References Cited

U.S. PATENT DOCUMENTS

| | | | | |
|---|---|---|---|---|
| 4,949,730 A | * | 8/1990 | Cobben ................ | A61B 5/4356 600/588 |
| 5,546,644 A | * | 8/1996 | Kakizaki ................ | G01P 1/023 29/25.35 |
| 6,491,647 B1 | * | 12/2002 | Bridger .................. | A61B 5/021 128/900 |
| 8,508,125 B2 | | 8/2013 | Stryakhilev et al. | |

(Continued)

FOREIGN PATENT DOCUMENTS

| KR | 10-2011-0072269 | 6/2011 |
|---|---|---|
| KR | 10-2011-0130143 | 12/2011 |

(Continued)

*Primary Examiner* — Max Noori
(74) *Attorney, Agent, or Firm* — F. Chau & Associates, LLC

(57) ABSTRACT

A display apparatus includes a substrate including a first area, a second area, and a bending area, the bending area disposed between the first area and the second area and bending about a bending axis running along a first direction; a first piezoelectric device disposed over the bending area; and a pressure sensor. The first piezoelectric device is configured to contract or expand according to a pressure variation sensed by the pressure sensor.

19 Claims, 8 Drawing Sheets

(56) References Cited

U.S. PATENT DOCUMENTS

| | | | |
|---|---|---|---|
| 9,318,539 B2 | 4/2016 | Wang et al. | |
| 2006/0250534 A1* | 11/2006 | Kutscher | G02F 1/13338 349/41 |
| 2010/0207602 A1* | 8/2010 | Loverich | G01N 29/022 324/76.49 |
| 2011/0242047 A1* | 10/2011 | Kim | G06F 3/0414 345/174 |
| 2012/0118068 A1* | 5/2012 | Yamada | G01L 9/0042 73/754 |
| 2014/0214209 A1* | 7/2014 | Sugiura | G01B 17/00 700/259 |
| 2015/0084003 A1 | 3/2015 | Kim et al. | |
| 2015/0192481 A1* | 7/2015 | Nguyen | G01L 1/22 345/206 |
| 2015/0287904 A1* | 10/2015 | White | H01L 41/113 310/319 |
| 2016/0211313 A1 | 7/2016 | Kim et al. | |
| 2016/0213309 A1* | 7/2016 | Sannholm | A61B 5/4815 |

FOREIGN PATENT DOCUMENTS

| | | |
|---|---|---|
| KR | 10-2014-0042553 | 4/2014 |
| KR | 10-2014-0112871 | 9/2014 |
| KR | 10-2015-0084229 | 7/2015 |
| KR | 10-2016-0088534 | 7/2016 |

\* cited by examiner

BENDABLE DISPLAY APPARATUS

CROSS-REFERENCE TO RELATED APPLICATION

This application claims priority under 35 U.S.C. § 119 to Korean Patent Application No. 10-2016-0011842, filed on Jan. 29, 2016 in the Korean Intellectual Property Office, the disclosure of which is incorporated by reference herein in its entirety.

TECHNICAL FIELD

One or more exemplary embodiments of the present invention relate to a display apparatus, and more particularly, to a bendable display apparatus.

DISCUSSION OF RELATED ART

A display apparatus includes display devices disposed on a substrate. A display apparatus may be made flexible by including a flexible substrate. In particular, a substrate may be bent at a portion thereof. Thus, a display apparatus may also be bendable.

However, an isolation of stacked structures may occur as the display apparatus is bent.

SUMMARY

One or more exemplary embodiments of the present invention include a bendable display apparatus.

According to one or more exemplary embodiments of the present invention, a display apparatus includes a substrate, a first piezoelectric device, and a pressure sensor. The substrate includes a first area, a second area, and a bending area. The bending area is disposed between the first area and the second area. The bending area extends in a first direction. The first piezoelectric device is disposed over the bending area. The first piezoelectric device is configured to contract or expand according to a pressure variation sensed by the pressure sensor.

The pressure sensor may include a strain gauge.

The display apparatus may further include a first wire. The first wire may be electrically connected to the first piezoelectric device. The pressure sensor may sense the pressure variation depending on a resistance variation of the first wire.

The first piezoelectric device may extend primarily in the first direction. The display apparatus may further include a first wire and a second wire. The first wire may be disposed at a first side of the first piezoelectric device in a second direction. The second direction may cross the first direction. The first wire may be electrically connected to the first piezoelectric device. The first wire may extend primarily in the first direction. The second wire may be disposed at a second side of the first piezoelectric device. The second side may be opposite to the first side. The second wire may be electrically connected to the first piezoelectric device. The second wire may extend primarily in the first direction.

Each of the first wire and the second wire may extend primarily in the first direction. Each of the first wire and the second wire may be in direct contact with the first piezoelectric device.

The display apparatus may further include a plurality of first signal lines, a plurality of second signal lines, and a plurality of pixels. The first signal lines may be disposed over the substrate. The first signal lines may extend in the first direction. The second signal lines may be disposed over the substrate. The second signal lines may extend in the second direction. The pixels may be electrically connected to the first signal lines and the second signal lines.

The display apparatus may further include an insulating layer. The insulating layer may be disposed over the substrate. The insulating layer may have a groove. The groove may extend primarily in the first direction. The first piezoelectric device may be at least partially disposed in the groove of the insulating layer.

The insulating layer may cover the first signal lines. The second signal lines may be disposed over the insulating layer and the first piezoelectric device.

The display apparatus may further include a second piezoelectric device, a third wire, and a fourth wire. The second piezoelectric device may be disposed over the bending area. The second piezoelectric device may extend primarily in the first direction. The third wire may be disposed at a first side of the second piezoelectric device in the second direction. The third wire may be electrically connected to the second piezoelectric device. The third wire may extend primarily in the first direction. The fourth wire may be disposed at a second side of the second piezoelectric device. The second side may be opposite to the first side. The fourth wire may be electrically connected to the second piezoelectric device. The fourth wire may extend primarily in the first direction.

Each of the first wire and the second wire may extend primarily in the first direction. Each of the first wire and the second wire may be in direct contact with the first piezoelectric device. Each of the third wire and the fourth wire may extend primarily in the first direction. Each of the third wire and the fourth wire may be in direct contact with the second piezoelectric device.

The display apparatus may further include a first main wire and a second main wire. The first main wire may be disposed at a third side of the first piezoelectric device and the second piezoelectric device in the first direction. The second main wire may be disposed at a fourth side of the first piezoelectric device and the second piezoelectric device. The fourth side may be opposite to the third side. The first wire and the third wire may be electrically connected to the first main wire. The second wire and the fourth wire may be electrically connected to the second main wire.

The display apparatus may further include a plurality of first signal lines, a plurality of second signal lines, and a plurality of pixels. The first signal lines may be disposed over the substrate. The first signal lines may extend in the first direction. The second signal lines may be disposed over the substrate. The second signal lines may extend in the second direction. The pixels may be electrically connected to the first signal lines and the second signal lines.

The display apparatus may further include an insulating layer. The insulating layer may be disposed over the substrate. The insulating layer may have grooves. The grooves may extend in the first direction. The first piezoelectric device and the second piezoelectric device may be at least partially disposed in the grooves of the insulating layer.

The insulating layer may cover the first signal lines. The second signal lines may be disposed over the insulating layer, the first piezoelectric device, and the second piezoelectric device.

According to one or more exemplary embodiments of the present invention, a display apparatus includes a substrate, a piezoelectric device, and a pressure sensor. The substrate includes a bending area bending about a bending axis. The piezoelectric device is disposed over the bending area. The piezoelectric device is configured to contract or expand according to a pressure variation sensed by the pressure sensor.

The pressure sensor may include a strain gauge.

The display apparatus may further include a first wire. The first wire may be electrically connected to the piezoelectric device. The pressure sensor may sense the pressure variation depending on a resistance variation of the first wire.

According to one or more exemplary embodiments of the present invention, a display apparatus includes a substrate, a piezoelectric device, and a pressure sensor. The substrate includes a bending area. The piezoelectric device is disposed over the bending area. A volume of the piezoelectric device is configured to change according to a pressure variation sensed by the pressure sensor.

The pressure sensor may include a strain gauge.

Electric signals may be applied to the piezoelectric device to change the volume of the piezoelectric device.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION OF THE EMBODIMENTS

Figure 1:
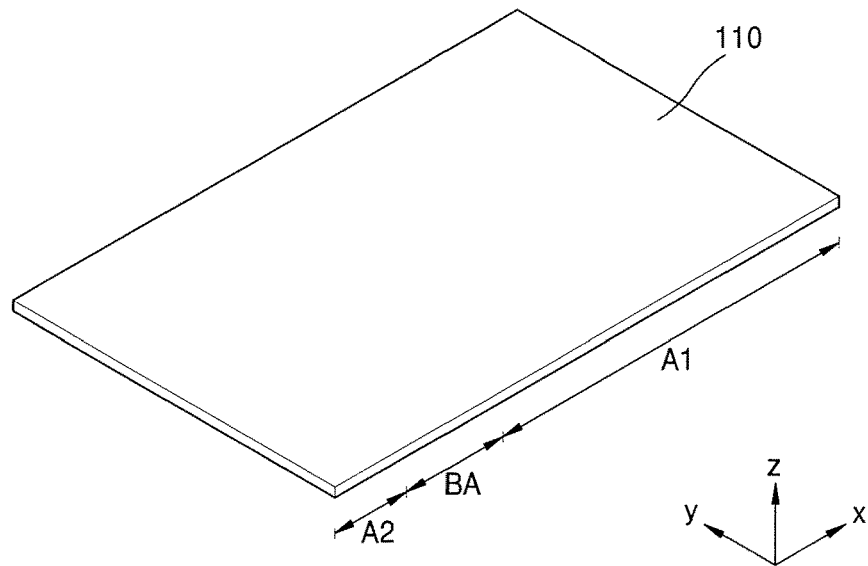
FIG. 1 is a schematic perspective view illustrating a substrate of a display apparatus in a flat state according to an exemplary embodiment of the present invention.

Exemplary embodiments of the present invention will be described below with reference to the accompanying drawings. In this regard, the exemplary embodiments may have different forms and should not be construed as being limited to the exemplary embodiments of the present invention described herein.

Hereinafter, exemplary embodiments of the present invention will be described in detail with reference to the accompanying drawings. Like reference numerals may refer to like elements throughout the specification and drawings.

Sizes of components in the drawings may be exaggerated for clarity of description.

The x-axis, the y-axis and the z-axis might not be limited to three axes of the rectangular coordinate system, and may be interpreted in a broader sense. For example, the x-axis, the y-axis, and the z-axis may represent directions that are substantially perpendicular to one another. Alternatively, the x-axis, the y-axis, and the z-axis may represent different directions that are not substantially perpendicular to one another.

Figure 2:
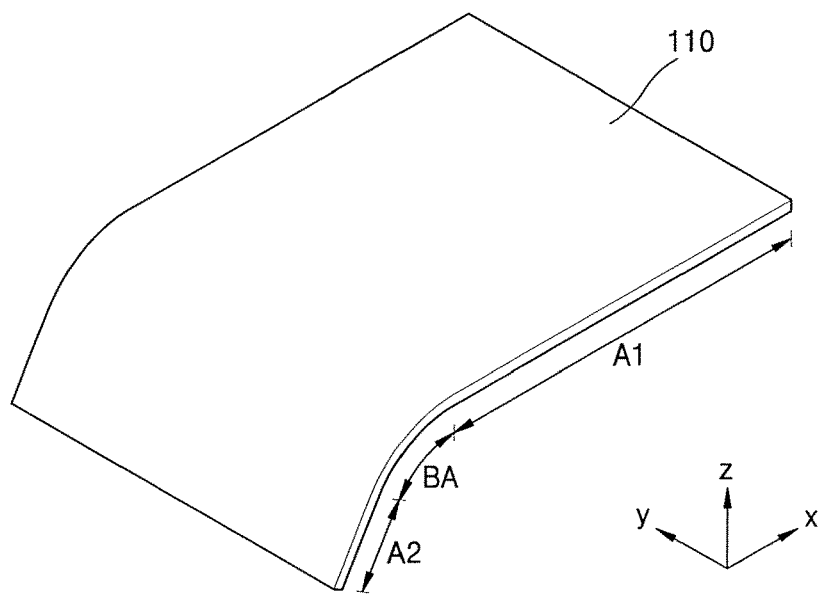
FIG. 2 is a schematic perspective view illustrating a substrate of FIG. 1 bent at a bending region according to an exemplary embodiment of the present invention.
Figure 3:
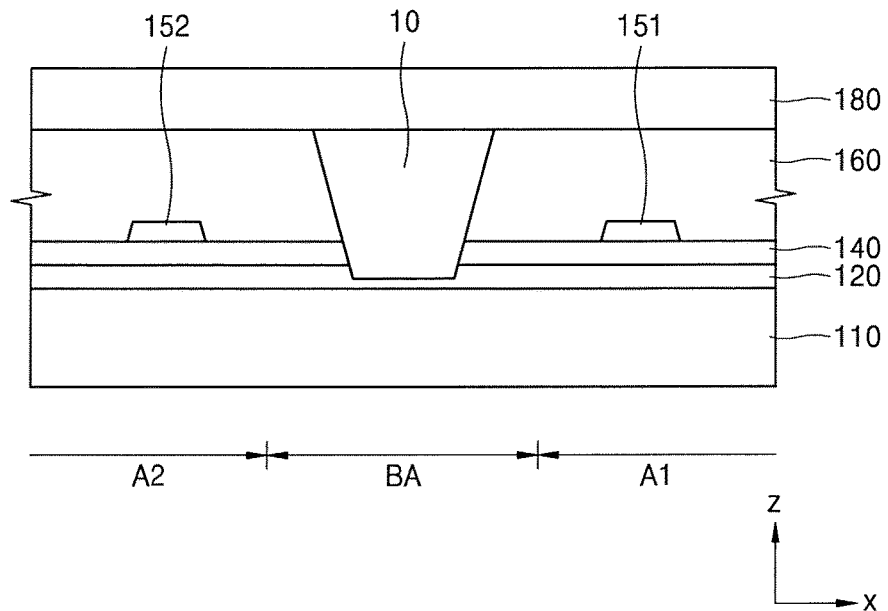
FIG. 3 is a schematic cross-sectional view illustrating a portion of a display apparatus including a substrate according to an exemplary embodiment of the present invention.

FIG. 1 is a schematic perspective view illustrating a substrate of a display apparatus in a flat state according to an exemplary embodiment of the present invention. FIG. 2 is a schematic perspective view illustrating a substrate of FIG. 1 bent at a bending region according to an exemplary embodiment of the present invention. FIG. 3 is a schematic perspective view illustrating a portion of a display apparatus including a substrate according to an exemplary embodiment of the present invention.

As illustrated in FIGS. 1 to 3, a display apparatus according to an exemplary embodiment of the present invention may include a substrate 110, a first piezoelectric device 10, and a pressure sensor.

The substrate 110 may include a first area A1, a second area A2, and a bending area BA. The bending area BA may be disposed between the first area A1 and the second area A2. The bending area BA may extend in a first direction (e.g., a +y direction) as illustrated in FIGS. 1 and 2. The substrate 110 may be bent about a y-axis in the bending area BA as illustrated in FIG. 2. The substrate 110 may be flexible. The substrate 110 that is flexible may include various materials, for example, polymer resins such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 110 may be formed on a rigid carrier. The substrate 110 may be separated from the rigid carrier during a manufacturing process. The rigid carrier may include, for example, glass; however, exemplary embodiments of the present invention are not limited thereto. The substrate 110 may include a relatively thin glass or a metal material.

Figure 5:
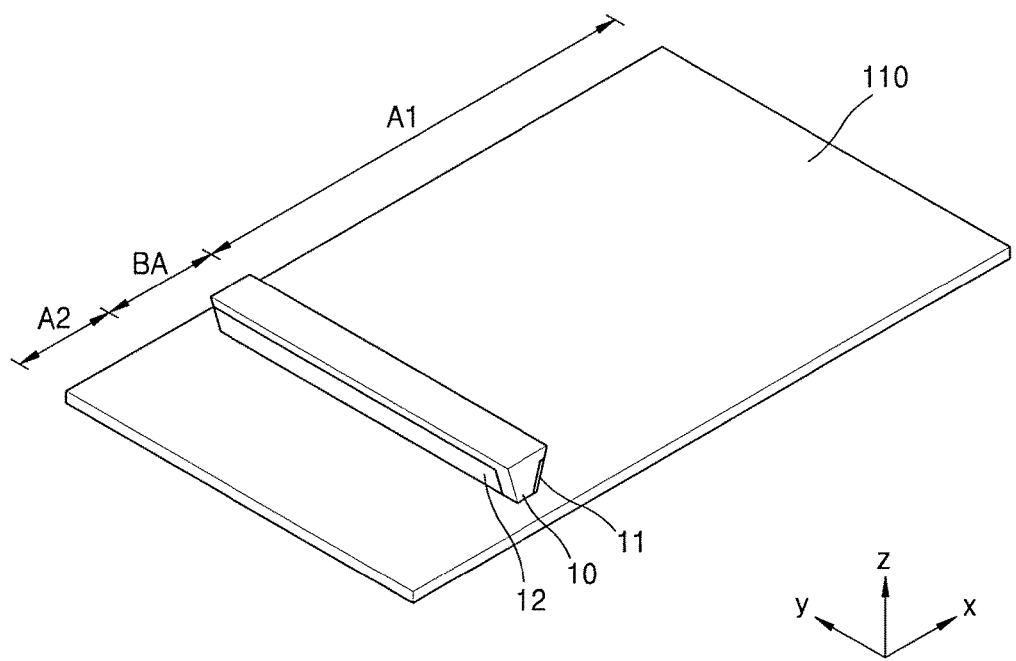
FIG. 5 is a schematic perspective view illustrating a portion of a display apparatus of FIG. 4 according to an exemplary embodiment of the present invention.

The first piezoelectric device 10 may be disposed over the bending area BA of the substrate 110. The first piezoelectric device 10 may extend in the first direction (e.g., the +y direction) as illustrated in FIG. 5. The first piezoelectric device 10 may include an inorganic material. Alternatively, the first piezoelectric device 10 may include an organic material. When the first piezoelectric device 10 includes an inorganic material, the first piezoelectric device 10 may include, for example, a ceramic material. The ceramic material may include a metal oxide including iron (III) oxide ($Fe_2O_3$), manganese dioxide ($MnO_2$), vanadium pentoxide ($V_2O_5$), zinc oxide (ZnO), lithium tantalite ($LiTaO_3$), lithium niobate ($LiNbO_3$), $PbTiO_3$ or $Pb(Zr,Ti)O_3$. Alternatively, the first piezoelectric device 10 may include a metal nitride such as aluminum nitride (AlN). When the first piezoelectric device 10 includes an organic material, the first piezoelectric device 10 may include, for example, polyvinylidene fluoride (PVDF).

The display apparatus according to an exemplary embodiment of the present invention may include various components, in addition to the aforementioned elements. For example, as illustrated in FIG. 3, the display apparatus may include a buffer layer 120. The buffer layer 120 may be disposed over the substrate 110. The buffer layer 120 may reduce or prevent impurities from infiltrating into a semiconductor layer from the substrate 110. The buffer layer 120 may also planarize an upper surface of the substrate 110. The buffer layer 120 may include silicon oxide, silicon nitride, or silicon oxynitride. The buffer layer 120 may have a single-layered structure. Alternatively, the buffer layer 120 may have a multi-layered structure.

The semiconductor layer may be disposed on the buffer layer 120. The display apparatus may include a gate insulating layer 140. The gate insulating layer 140 may cover the semiconductor layer. The gate insulating layer 140 may include silicon oxide, silicon nitride, or silicon oxynitride.

Figure 8:
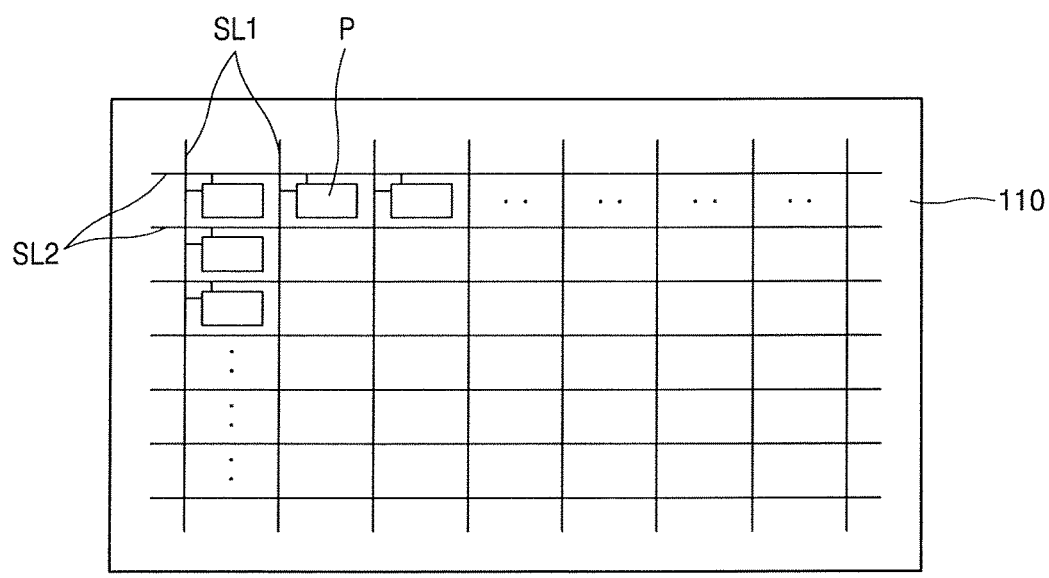
FIG. 8 is a schematic plan view illustrating a portion of a display apparatus of FIG. 7 according to an exemplary embodiment of the present invention.

The display apparatus may include a first gate electrode 151. The display apparatus may further include a second gate electrode 152. The first and second gate electrodes 151 and 152 may be disposed over the gate insulating layer 140. As illustrated in FIG. 3, the first gate electrode 151 may be disposed in the first area A1 of the substrate 110. The second gate electrode 152 may be disposed in the second area A2 of the substrate 110. The first and second gate electrodes 151 and 152 may be substantially simultaneously formed with, for example, a plurality of first signal lines SL1 as illustrated in FIG. 8. The first signal lines SL1 may be disposed over the substrate 110. The first and second gate electrodes 151 and 152 may be substantially simultaneously formed with the first signal lines SL1 by using substantially the same material as the first signal lines SL1. The first signal lines SL1 may be, for example, scan lines. The first and second gate electrodes 151 and 152 may include copper (Cu), aluminum (Al), molybdenum (Mo), or an alloy thereof. The gate electrodes 151 and 152 may have a single-layered structure. Alternatively, the gate electrodes 151 and 152 may have a multi-layered structure. The display apparatus may include an interlayer insulating layer 160. The interlayer insulating layer 160 may cover the first and second gate electrodes 151 and 152. The interlayer insulating layer 160 may include silicon oxide, silicon nitride, or silicon oxynitride.

The interlayer insulating layer 160 may have a groove. The groove may extend in the first direction (e.g., the +y direction) as illustrated in FIG. 3. The first piezoelectric device 10 may be at least partially disposed in the groove of the interlayer insulating layer 160. A depth of the groove may be less than a thickness of the interlayer insulating layer 160. Thus, the groove might not penetrate through the interlayer insulating layer 160. Alternatively, as illustrated in FIG. 3, the groove may completely penetrate through the interlayer insulating layer 160 (e.g., in a −z direction). In addition to the interlayer insulating layer 160, a stacked structure including the gate insulating layer 140 and/or the buffer layer 120 may be referred to as an insulating layer. Thus, the insulating layer (i.e., the stack structure) may include the groove.

The first and second gate electrodes 151 and 152 may be disposed in the insulating layer (e.g., the stacked structure). Thus, the first and second gate electrodes 151 and 152 or the first signal lines SL1 may be covered by the insulating layer (e.g., the stacked structure). In addition, as illustrated in FIG. 3, the first piezoelectric device 10 may be entirely disposed within the groove; however, exemplary embodiments of the present invention are not limited thereto.

The display apparatus may include a layer 180. The layer 180 may be referred to as a planarization layer or a protective layer. The layer 180 may be disposed over the interlayer insulating layer 160. The layer 180 may cover the first piezoelectric device 10. The layer 180 may also cover the interlayer insulating layer 160. The layer 180 may include an organic material such as polyacryl or polyimide. Alternatively, the layer 180 may include an inorganic material. The layer 180 may have a single-layered. Alternatively, the layer 180 may have a multi-layered structure.

According to an exemplary embodiment of the present invention, when the display apparatus is bent, an isolation of or damage to the stack structures may be reduced. For example, when the display apparatus is bent as illustrated in FIG. 2, a pressure may generate in the bending area BA. The pressure sensor may sense the pressure generated in the bending area BA. The pressure sensor may change a volume of the first piezoelectric device 10 in correspondence with the pressure. Accordingly, the isolation of or damage to the stack structures may be reduced.

For example, as illustrated in FIG. 2, the display apparatus may be bent so that a lower surface (e.g., in a −z direction) of the substrate 110, for example, an external surface of the substrate 110 may have a concave shape. Accordingly, layers in the bending area BA may have a tensile stress. When the pressure sensor senses the tensile stress, the pressure sensor may allow the first piezoelectric device 10 to expand. The expansion of the first piezoelectric device 10 may increase the volume of the first piezoelectric device 10. Therefore, damage to the layers in the bending area BA may be reduced or prevented.

Alternatively, the display apparatus may be bent so that the lower surface (e.g., in the −z direction) of the substrate 110, for example, the external surface of the substrate 110 may have a convex shape. Accordingly, layers in the bending area BA may have a compressive stress. When the pressure sensor senses the compressive stress, the first piezoelectric device 10 may contract. The contraction of the first piezoelectric device 10 may reduce the volume of the first piezoelectric device 10. Therefore, damage to the layers in the bending area BA may be reduced or prevented.

The pressure sensor may include a resistance changing unit. The resistance changing unit may be disposed in the bending area BA of the substrate 110. The resistance changing unit may have a shape that varies depending on a bending direction of the substrate 110, which may change a resistance thereof. The pressure sensor may also include a resistance measurement unit. The resistance measurement unit may measure a variation amount of the resistance at the resistance changing unit. The resistance changing unit may include a metal. The resistance changing unit may be disposed in the bending area BA of the substrate 110. When the compressive stress or the tensile stress due to the bending of the substrate 110 is applied to the resistance changing unit, a cross-sectional area or a length of the resistance changing unit may change. Accordingly, the resistance of the bending area BA of the display apparatus may change. The pressure sensor may be, for example, a strain gauge.

In order to contract or expand the first piezoelectric device 10, electric signals may be applied to the first piezoelectric device 10. A first wire 11 and a second wire 12 may be arranged to be electrically connected to the first piezoelectric device 10. The first wire 11 or the second wire 12 may be used as the resistance changing unit. The first wire 11 or the second wire 12 may be used as a line for applying the electric signals to the first piezoelectric device 10. For example, the compressive stress or the tensile stress may be applied to the first wire 11 as the substrate 110 is bent. Accordingly, the shape of the first wire 11 may be changed.

The resistance of the bending area BA may also be changed. Thus, the resistance changing unit may measure a resistance variation of the first wire 11. The resistance changing unit may contract or expand the volume of the first piezoelectric device 10 according to a measurement result.

Figure 4:
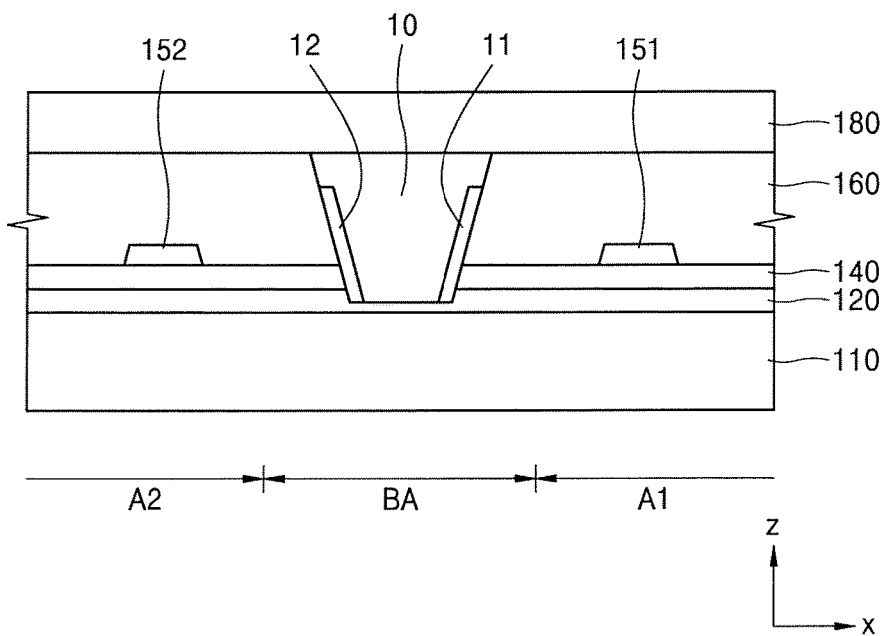
FIG. 4 is a schematic cross-sectional view illustrating a portion of a display apparatus according to an exemplary embodiment of the present invention.

The first wire 11 or the second wire 12 may be formed substantially simultaneously with a source electrode or a drain electrode of a thin film transistor. The first wire 11 or the second wire 12 may be formed by using substantially the same material as the source or drain electrode of the thin film transistor. Although not illustrated in FIG. 4, the source electrode or the drain electrode corresponding to the first gate electrode 151 and the second gate electrode 152, respectively, may be disposed on the interlayer insulating layer 160. Before forming the first piezoelectric device 10, the first wire 11 or the second wire 12 may be formed in the groove of the interlayer insulating layer 160. The first wire 11 or the second wire 12 may be formed at substantially the same time as the source electrode or the drain electrode on the interlayer insulating layer 160. The first wire 11 or the second wire 12 may be formed by using substantially the same material as the source electrode or the drain electrode. The first piezoelectric device 10 may be at least partially disposed in the groove. Thus, a structure of a display apparatus as illustrated in FIG. 4 may be obtained. As illustrated in FIG. 4, the first piezoelectric device 10 may cover an upper surface of the first wire 11 or the second wire 12. The first piezoelectric device 10 may cover the upper surface of the first wire 11 or the second wire 12 in a direction away from the substrate 110 (e.g., a +z direction). Thus, a shorting of the first wire 11 or the second wire 12 with another conductor in the display apparatus may be prevented.

FIG. 5 is a schematic perspective view illustrating a portion of a display apparatus of FIG. 4 according to an exemplary embodiment of the present invention.

Referring to FIG. 5, since the first piezoelectric device 10 may extend in the first direction (e.g., the +y direction), the first wire 11 and the second wire 12 may also extend in the first direction (e.g., the +y direction). The first wire 11 may be disposed at a first side of the first piezoelectric device 10 in a second direction (e.g., a +x direction). The second direction may cross the first direction (e.g., the +y direction). The first wire 11 disposed at the first side of the first piezoelectric device 10 may be electrically connected to the first piezoelectric device 10. The second wire 12 may be disposed at a second side of the first piezoelectric device 10. The second side of the first piezoelectric device 10 may be opposite to the first side of the first piezoelectric device 10. The second wire 12 disposed at the second side of the first piezoelectric device 10 may be electrically connected to the first piezoelectric device 10. The first and second wires 11 and 12 may each be in direct contact with the first piezoelectric device 10. Thus, a volume variation of the first piezoelectric device 10 may occur.

Figure 6:
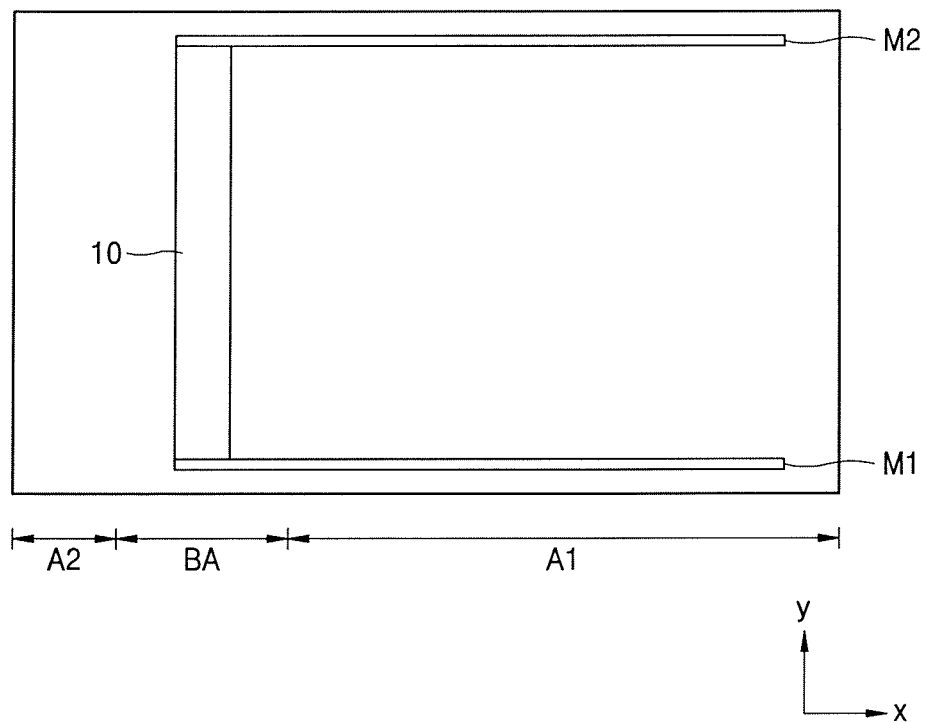
FIG. 6 is a schematic plan view illustrating a portion of a display apparatus according to an exemplary embodiment of the present invention.

FIG. 6 is a schematic plan view illustrating a portion of a display apparatus according to an exemplary embodiment of the present invention.

Referring to FIG. 6, the display apparatus may further include a first main wire M1 and a second main wire M2. The first main wire M1 may be disposed at a third side of the first piezoelectric device 10 in the first direction (e.g., the +y direction). The second main wire M2 may be disposed at a fourth side of the first piezoelectric device 10. The fourth side of the first piezoelectric device 10 may be opposite the third side of the first piezoelectric device 10. The first main wire M1 may be electrically connected to the first wire 11.

The second main wire M2 may be electrically connected to the second wire 12. Therefore, electric signals may be applied to the first and second wires 11 and 12 via the first and second main wires M1 and M2, respectively.

The first main wire M1 and the second main wire M2 may both be in direct contact with the first piezoelectric device 10 as illustrated in FIG. 6. However, as illustrated in FIG. 5, the second wire 12 may extend to an end of the fourth side of the piezoelectric device 10 (e.g., in the +y direction). The second wire 12 extending to an end of the fourth side of the piezoelectric device 10 may be electrically connected to the second main wire M2 as illustrated in FIG. 6. The second wire 12 might not extend to an end of the third side of the piezoelectric device 10 (e.g., in the −y direction). Accordingly, the second wire 12 might not be electrically connected to the first main wire M1 as illustrated in FIG. 6. Similarly, the first wire 11 may extend to the end of the third side of the first piezoelectric device 10 (e.g., in the −y direction) as illustrated in FIG. 5. The first wire 11 extending to an end of the third side of the piezoelectric device 10 may be electrically connected to the first main wire M1 as illustrated in FIG. 6. The first wire 11 might not extend to the end of the fourth side of the first piezoelectric device 10 (e.g., in the +y direction). Accordingly, the first wire 11 might not be electrically connected to the second main wire M2 as illustrated in FIG. 6.

Figure 7:
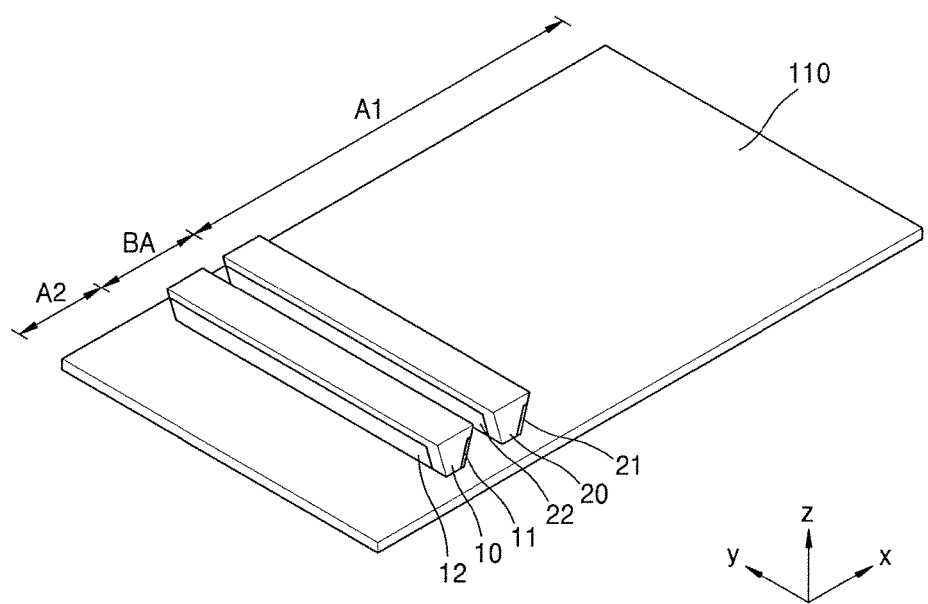
FIG. 7 is a schematic perspective view illustrating a portion of a display apparatus according to an exemplary embodiment of the present invention.

FIG. 7 is a schematic perspective view illustrating a portion of a display apparatus according to an exemplary embodiment of the present invention. FIG. 8 is a schematic plan view illustrating a portion of a display apparatus of FIG. 7 according to an exemplary embodiment of the present invention.

Referring to FIG. 8, the display apparatus may include a plurality of first signal lines SL1. The first signal lines SL1 may be disposed over the substrate 110. The first signal lines SL1 may extend in the first direction (e.g., the +y direction). The display apparatus may also include a plurality of second signal lines SL2. The second signal lines SL2 may be disposed over the substrate 110. The second signal lines SL2 may extend in the second direction (e.g., the +x direction). The display apparatus may also include a plurality of pixels P. The pixels P may be electrically connected to the first signal lines SL1 and the second signal lines SL2. The pixels P may include pixel electrodes, an opposite electrode, and an intermediate layer. The intermediate layer may be disposed between the pixel electrodes and the opposite electrode. The intermediate layer may include an emission layer. According to an exemplary embodiment of the present invention, the display apparatus may be an organic light-emitting display apparatus. The first signal lines SL1 may be data lines. The second signal lines SL2 may be scan lines. A power supply line, etc. may be further provided over the substrate 110.

Figure 9:
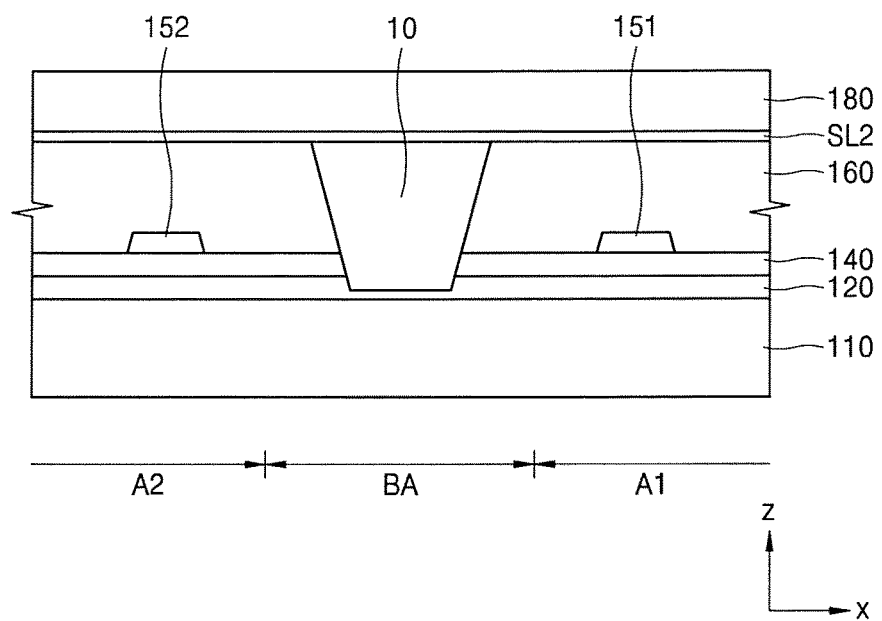
FIG. 9 is a schematic cross-sectional view illustrating a portion of a display apparatus according to an exemplary embodiment of the present invention.

FIG. 9 is a schematic cross-sectional view illustrating a portion of a display apparatus according to an exemplary embodiment of the present invention. The interlayer insulating layer 160 may have a groove. The groove may extend in the first direction (e.g., the +y direction) as illustrated in FIG. 9. The first piezoelectric device 10 may be at least partially disposed in the groove. The groove may have a depth that is smaller than a thickness of the interlayer insulating layer 160. Accordingly, the groove might not penetrate through the interlayer insulating layer 160. Alternatively, the groove may completely penetrate through the interlayer insulating layer 160 (e.g., in the −z direction) as illustrated in FIG. 9. A stacked structure including the gate insulating layer 140 and/or the buffer layer 120 in addition to the interlayer insulating layer 160 may be referred to as an insulating layer. The insulating layer (e.g., the stacked structure) may have the groove.

Since the first and second gate electrodes 151 and 152 or the first signal lines SL1 may be located in the insulating layer (e.g., the stacked structure), the first and second gate electrodes 151 and 152 or the first signal lines SL1 may be covered by the insulating layer(e.g., the stacked structure). In addition, the second signal lines SL2 may be disposed over the insulating layer. As illustrated in FIG. 9, the second signal lines SL2 may be disposed on the interlayer insulating layer 160. The second signal lines SL2 may also be disposed on the first piezoelectric device 10. The second signal lines SL2 may be formed substantially simultaneously with the source electrode or the drain electrode of the thin film transistor. The second signal lines SL2 may be formed by using substantially the same material as the source electrode or the drain electrode.

The display apparatus may include the first piezoelectric device 10 as described herein; however exemplary embodiments of the present invention are not limited thereto. For example, the display apparatus may include a plurality of piezoelectric devices.

Referring to FIG. 7, the display apparatus may further include a second piezoelectric device 20, a third wire 21, and a fourth wire 22. The second piezoelectric device 20 may be located in the bending area BA of the substrate 110. Similar to the first piezoelectric device 10, the second piezoelectric device 20 may extend in the first direction (e.g., the +y direction). The third wire 21 may be disposed at a first side of the second piezoelectric device 20. The third wire 21 may be disposed at the first side of the second piezoelectric device 20 in the second direction (e.g., the +x direction). The second direction may cross the first direction (e.g., the +y direction). Thus, the third wire 21 disposed at the first side of the second piezoelectric device 20 may be electrically connected to the second piezoelectric device 20. The fourth wire 22 may be disposed at a second side of the second piezoelectric device 20. The fourth wire 22 disposed at the second side of the second piezoelectric device 20 may be electrically connected to the second piezoelectric device 20. The second side of the second piezoelectric device 20 may be opposite to the first side of the second piezoelectric device 20. The third wire 21 and the fourth wire 22 may be in direct contact with the second piezoelectric device 20. Thus, a volume variation of the second piezoelectric device 20 may occur.

The display apparatus may include the plurality of piezoelectric devices in the bending area BA. Thus, an occurrence of stress therein corresponding to the bending of the display apparatus may be reduced. Damage to the components of the display apparatus may therefore be reduced or prevented. In particular, within the bending area BA, a magnitude of the compressive stress or the tensile stress may vary depending on locations in the bending area BA. Since the display apparatus may include the plurality of piezoelectric devices, the piezoelectric devices may expand and/or contract differently from each other in correspondence with the magnitude of the stress applied to the location of each of the piezoelectric devices. Thus, damage to the components in the bending area BA may be reduced. For example, the volume of the first piezoelectric device 10 adjacent to the first wire 11 and/or the second wire 12 may be adjusted according to the resistance variation by using the first wire 11 and/or the second wire 12 as the resistance changing unit. The volume of the second piezoelectric device 20 adjacent to the third wire 21 and/or the fourth wire 22 may be adjusted according to the resistance variation measured by using the third wire 21 and/or the fourth wire 22 as the resistance changing unit. Thus, the first piezoelectric device 10 and the second piezoelectric device 20 may respond to the stress variation at their respective positions.

Figure 10:
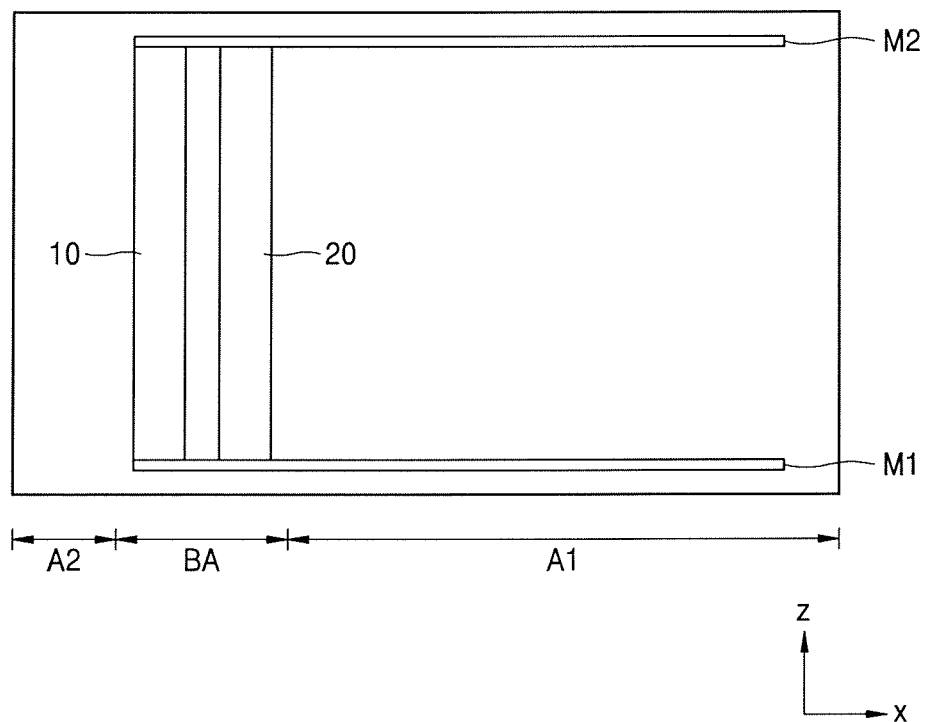
FIG. 10 is a schematic plan view illustrating a portion of a display apparatus according to an exemplary embodiment of the present invention.

FIG. 10 is a schematic plan view illustrating a portion of a display apparatus according to an exemplary embodiment of the present invention.

Referring to FIG. 10, the display apparatus may further include the first main wire M1 and the second main wire M2. The first main wire M1 may be disposed at a third side of the first piezoelectric device 10 in the first direction (e.g., the +y direction). The second main wire M2 may be disposed at a fourth side of the first piezoelectric device 10. The fourth side of the first piezoelectric device 10 may be opposite to the third side of the piezoelectric device 10. The first main wire M1 may be electrically connected to the first wire 11 and the third wire 21 illustrated in FIG. 7. The second main wire M2 may be electrically connected to the second wire 12 and the fourth wire 22 illustrated in FIG. 7. Electric signals may be applied to the first wire 11, the second wire 12, the third wire 21, and the fourth wire 22 illustrated in FIG. 7 via the first main wire M1 and the second main wire M2.

The first main wire M1 and the second main wire M2 may be in direct contact with the first piezoelectric device 10 and the second piezoelectric device 20, as illustrated in FIG. 10. However, the second wire 12 may extend to an end of the fourth side of the first piezoelectric device 10 (e.g., in the +y direction) as illustrated in FIG. 9. The second wire 12 extended to the end of the fourth side of the first piezoelectric device 10 may be electrically connected to the second main wire M2 illustrated in FIG. 10. The second wire 12 might not extend to an end of the third side of the first piezoelectric device 10 (e.g., in the −y direction). Thus, the second wire 12 might not be electrically connected to the first main wire M1 illustrated in FIG. 10. The fourth wire 22 may extend to an end of the fourth side of the second piezoelectric device 20 (e.g., in the +y direction) as illustrated in FIG. 9. The fourth wire 22 extended to the end of the fourth side of the second piezoelectric device 20 may be electrically connected to the second main wire M2 illustrated in FIG. 10. The fourth wire 22 might not extend to an end of the third side of the second piezoelectric device 20 (e.g., in the −y direction). Thus, the fourth wire 22 might not be electrically connected to the first main wire M1 illustrated in FIG. 10.

Similarly, the first wire 11 may extend to the end of the third side of the first piezoelectric device 10 (e.g., in the −y direction) as illustrated in FIG. 9. The first wire 11 extended to the end of the third side of the first piezoelectric device 10 may be electrically connected to the first main wire M1 illustrated in FIG. 10. The first wire 11 might not extend to the end of the fourth side of the first piezoelectric device 10 (e.g., in the +y direction). Thus, the first wire 11 might not be electrically connected to the second main wire M2 illustrated in FIG. 10. The third wire 21 may extend to the end of the third side of the second piezoelectric device 20 (e.g., in the −y direction) as illustrated in FIG. 9. The third wire 21 extended to the end of the third side of the second piezoelectric device 20 may be electrically connected to the first main wire M1 illustrated in FIG. 10. The third wire 21 might not extend to the end of the fourth side of the second piezoelectric device 20 (e.g., in the +y direction). Thus, the third wire 21 might not be electrically connected to the second main wire M2 illustrated in FIG. 10.

Through the above structure, electric signals may be substantially simultaneously applied to the first piezoelectric device 10 and the second piezoelectric device 20 via the first main wire M1 and the second main wire M2.

When the plurality of piezoelectric devices are provided, the display apparatus may include the first signal lines SL1. The first signal lines SL1 may extend in the first direction (e.g., the +y direction). The display apparatus may also include the second signal lines SL2. The second signal lines SL2 may be disposed over the substrate 110. The second signal lines SL2 may extend in the second direction (e.g., the +x direction). The display apparatus may further include the pixels P. The pixels P may be electrically connected to each of the first signal lines SL1 and the second signal lines SL2.

The interlayer insulating layer 160 of FIG. 8 may have grooves. The grooves may extend in the first direction (e.g., the +y direction). The first piezoelectric device 10 and the second piezoelectric device 20 may be at least partially disposed in the grooves. The grooves may have a depth that is smaller than the thickness of the interlayer insulating layer 160. Thus, the grooves may not penetrate through the interlayer insulating layer 160. Alternatively, the grooves may completely penetrate through the interlayer insulating layer 160 (e.g., in the −z direction) as illustrated in FIG. 8. A stacked structure including the gate insulating layer 140 and/or the buffer layer 120 in addition to the interlayer insulating layer 160 may be referred to as an insulating layer. The insulating layer (i.e., the stacked structure) may have the grooves.

The first and second gate electrodes 151 and 152 or the first signal lines SL1 may be disposed in the insulating layer (i.e., the stacked structure). The first and second gate electrodes 151 and 152 or the first signal lines SL1 may be covered by the insulating layer (i.e., the stacked structure). As described with reference to FIG. 8, the second signal lines SL2 may be disposed over the interlayer insulating layer 160, the first piezoelectric device 10, and the second piezoelectric device 20. The second signal lines SL2 may be formed substantially simultaneously with the source electrode or the drain electrode of the thin film transistor. The second signal lines SL2 may be formed by using substantially the same material as the source electrode or the drain electrode.

According to the one or more exemplary embodiments of the present invention, the display apparatus having reduced damage when it is bent may be provided. However, the scope of the exemplary embodiments of the present invention is not limited thereto.

It should be understood that exemplary embodiments of the present invention described herein should be considered in a descriptive sense only and not for purposes of limitation. Descriptions of features or aspects within each exemplary embodiment of the present invention should typically be considered as available for other similar features or aspects in other exemplary embodiments of the present invention.

While one or more exemplary embodiments of the present invention have been described with reference to the figures, it will be understood by those of ordinary skill in the art that various changes in form and details may be made therein without departing from the spirit and scope of the present invention.

What is claimed is:

1. A display apparatus, comprising:
    a substrate comprising a first area, a second area, and a bending area, the bending area disposed between the first area and the second area and extending in a first direction;
    an insulating layer disposed over the substrate and having a groove extending primarily in the first direction, the groove corresponding to the bending area;
    a first piezoelectric device disposed at least partially in the groove the insulating layer; and
    a pressure sensor, the pressure sensor including a resistance changing unit disposed in the bending area,
    wherein the first piezoelectric device is configured to contract or expand according a pressure variation sensed by the pressure sensor.

2. The display apparatus of claim 1, wherein the pressure sensor comprises a strain gauge.

3. The display apparatus of claim 1, wherein the resistance changing unit is a first wire electrically connected to the first piezoelectric device,
    wherein the pressure sensor senses the pressure variation depending on a resistance variation of the first wire.

4. The display apparatus of claim 1, wherein the first piezoelectric device extends primarily in the first direction, and the display apparatus further comprises:
    a first wire disposed at a first side of the first piezoelectric device and extending primarily in a second direction that crosses the first direction, the first wire being electrically connected to the first piezoelectric device and extending primarily in the first direction; and
    a second wire disposed at a second side of the first piezoelectric device, wherein the second side is opposite to the first side, the second wire being electrically connected to the first piezoelectric device and extending in the first direction.

5. The display apparatus of claim 4, wherein each of the first wire and the second wire extends primarily in the first direction and are in direct contact with the first piezoelectric device.

6. The display apparatus of claim 4, further comprising:
    a plurality of first signal lines disposed over the substrate and extending in the first direction;
    a plurality of second signal lines disposed over the substrate and extending in the second direction; and
    a plurality of pixels electrically connected to the first signal lines and the second signal lines.

7. The display apparatus of claim 6, wherein the insulating layer covers the first signal lines, and the second signal lines are disposed over the insulating layer and the first piezoelectric device.

8. The display apparatus of claim 4, further comprising:
    a second piezoelectric device disposed over the bending area and extending primarily in the first direction;
    a third wire disposed at a first side of the second piezoelectric device in the second direction, the third wire being electrically connected to the second piezoelectric device and extending primarily in the first direction; and
    a fourth wire disposed at a second side of the second piezoelectric device, wherein the second side is opposite to the first side, the fourth wire being electrically connected to the second piezoelectric device and extending primarily in the first direction.

9. The display apparatus of claim 8, wherein each of the first wire and the second wire extends primarily in the first direction and are in direct contact with the first piezoelectric device, and each of the third wire and the fourth wire extends primarily in the first direction and are in direct contact with the second piezoelectric device.

10. The display apparatus of claim 9, further comprising:
a first main wire disposed at a third side of the first piezoelectric device and the second piezoelectric device in the first direction; and
a second main wire disposed at a fourth side of the first piezoelectric device and the second piezoelectric device, wherein the fourth side is opposite to the third side,
wherein the first wire and the third wire are electrically connected to the first main wire, and the second wire and the fourth wire are electrically connected to the second main wire.

11. The display apparatus of claim 8, further comprising:
a plurality of first signal lines disposed over the substrate and extending in the first direction;
a plurality of second signal lines disposed over the substrate and extending in the second direction; and
a plurality of pixels electrically connected to the first signal lines and the second signal lines.

12. The display apparatus of claim 11, wherein the second piezoelectric device is at least partially disposed in the grooves of the insulating layer.

13. The display apparatus of claim 12, wherein the insulating layer covers the first signal lines, and the second signal lines are disposed over the insulating layer, the first piezoelectric device, and the second piezoelectric device.

14. A display apparatus, comprising:
a substrate comprising a bending area, the substrate being bent in the bending area about a bending axis;
an insulating layer disposed over the substrate and having a groove corresponding to the bending area;
a piezoelectric device disposed at least partially in the groove of the insulating layer; and
a pressure sensor, the pressure sensor including a resistance changing unit disposed in the bending area,
wherein the piezoelectric device is configured to contract or expand according a pressure variation sensed by the pressure sensor, and
wherein the resistance changing unit includes a metal.

15. The display apparatus of claim 14, wherein the pressure sensor comprises a strain gauge.

16. The display apparatus of claim 14, wherein the resistance changing unit is a first wire electrically connected to the piezoelectric device,
wherein the pressure sensor senses the pressure variation depending on a resistance variation of the first wire.

17. A display apparatus, comprising:
a substrate comprising a bending area;
an insulating layer disposed over the substrate and having a groove corresponding to the bending area;
a piezoelectric device disposed at least partially in the groove of the insulating layer; and
a pressure sensor, the pressure sensor including a resistance changing unit disposed in the bending area and a resistance measurement unit,
wherein a volume of the piezoelectric device is configured to change according a pressure variation sensed by the pressure sensor.

18. The display apparatus of claim 17, wherein the pressure sensor comprises a strain gauge.

19. The display apparatus of claim 17, wherein electric signals are applied to the piezoelectric device to change the volume of the piezoelectric device.

* * * * *